United States Patent [19]

Maurinus et al.

[11] Patent Number: 5,358,412
[45] Date of Patent: Oct. 25, 1994

[54] METHOD AND APPARATUS FOR ASSEMBLING A FLEXIBLE CIRCUIT TO AN LCD MODULE

[75] Inventors: Martin A. Maurinus; Richard Delmerico, both of Rochester, N.Y.

[73] Assignee: Eastman Kodak Company, Rochester, N.Y.

[21] Appl. No.: 51,927

[22] Filed: Apr. 26, 1993

[51] Int. Cl.$^5$ ............................................. G02F 1/133
[52] U.S. Cl. ........................................ 439/66; 359/83; 439/67
[58] Field of Search .............................. 439/66, 68–73, 439/331, 67, 91, 77, 493; 359/83, 88

[56] References Cited

U.S. PATENT DOCUMENTS

| | | | |
|---|---|---|---|
| 3,718,842 | 2/1973 | Abbott, III et al. | 359/83 |
| 4,257,661 | 3/1981 | Dalamangas et al. | 339/75 |
| 4,344,662 | 8/1982 | Dalamangas et al. | 339/59 |
| 4,422,728 | 12/1983 | Andreaggi | 350/334 |
| 4,508,402 | 4/1985 | Tomino et al. | 439/67 |
| 4,545,647 | 10/1985 | Sasaki et al. | 350/331 |
| 4,598,960 | 7/1986 | DiSanto et al. | 339/17 |
| 4,643,499 | 2/1987 | Mitchell | 339/17 |
| 4,652,973 | 3/1987 | Baker et al. | 361/395 |
| 4,655,551 | 4/1987 | Washizuka et al. | 350/334 |
| 4,878,738 | 11/1989 | Hanami | 350/334 |
| 5,033,970 | 7/1991 | Buchoff | 439/66 |

FOREIGN PATENT DOCUMENTS 59-60420 4/1984 Japan ..................................... 359/88

*Primary Examiner*—Neil Abrams
*Attorney, Agent, or Firm*—David A. Hawley

[57] ABSTRACT

Apparatus for making an electrical interconnection between first and second, parallel, spaced apart, circuit bearing, substrates or boards and a flex circuit formed on a flexible film. At least one of the substrates or boards has at least one terminal pad formed on the surface thereof, and the flex circuit has at least one terminal pad formed on a surface thereof through an assembly. The apparatus includes resilient, elastomeric spacer means for being positioned between and cushioning the spaced apart, circuit bearing, substrates or boards at least adjacent the terminal pad on the at least one substrate of board and retainer means for compressing the elastomeric spacer means between the first and second, parallel, spaced apart, circuit bearing, substrates or boards and against the flexible circuit. The flexible circuit terminal pad overlies and is in contact with the terminal pad on the at least one printed circuit bearing substrate or board.

12 Claims, 5 Drawing Sheets

METHOD AND APPARATUS FOR ASSEMBLING A FLEXIBLE CIRCUIT TO AN LCD MODULE

CROSS-REFERENCE TO RELATED APPLICATION

Reference is hereby made to commonly assigned U.S. patent application Ser. No. 08/053,510 entitled METHOD AND APPARATUS FOR ASSEMBLING AN LCD MODULE filed on Apr. 26, 1993 in the names of Martin A. Maurinus and Richard Delmerico.

FIELD OF THE INVENTION

The present invention relates generally to the assembly of flexible circuits with parallel stacked printed circuits and more particularly to a simplified attachment of a flexible film circuit with the printed circuit board used to drive a liquid crystal display glass whereby assembly and disassembly is simplified and the module is rendered resistant to shock and vibration.

BACKGROUND OF THE INVENTION

Liquid crystal display ("LCD") modules are commonly employed to display alpha-numeric data such as date and time in timepieces, numerals in calculators, data stored in memory devices and a host of other applications where data display has been incorporated into a product. For example, it has become common in recent years to incorporate alpha-numeric LCD modules into camera bodies in order to display data to the photographer relating to film type, image frames remaining on the film cartridge, exposure parameters, flash illumination parameters and other camera status data. Such liquid crystal display modules are incorporated in the Kodak ® S500 camera body for displaying such data to the photographer.

The liquid crystal display element or "glass" of such LCD modules has become widely employed in standardized and customized component versions in the industry. The liquid crystal display material is layered and sealed between the mating or inner surfaces of upper and lower planar glass substrates on which nearly transparent, conductive, planar ground electrodes and segment shaped electrodes are formed, respectively. Upper and lower planar polarization layers, rotated at 90° polarization to one another, are adhered to the exterior surfaces of the upper and lower substrates. A reflective or mirror layer is adhered to the lower polarization layer.

The layers of liquid crystal display organic molecules are formed to exhibit interference patterns and light polarization when not influenced by an electrical field. In the absence of applied voltage, LCD material layers between the parallel ground and segment electrodes rotate polarized light passing through the upper polarization layer and allows it to be passed through the lower polarization layer and be reflected back, providing the bright background of the display 12. Depending upon the magnitude of the voltage applied between the parallel planar electrode and the segment electrodes, dark alpha-numeric characters are formed on the light background by a reorganization of the molecules between the ground and the segment electrodes which does not display polarized light rotation. The non-rotated light is blocked from striking the reflective mirror by the lower polarization layer, resulting in the dark character segments. Because LCD devices have a very high internal impedance, the current drawn by the device is small, making LCD's desirable for low current drain applications, e.g. battery operated cameras.

The LCD glass is usually rectangular in configuration and has at least one linear array of conductor terminal aligned pads along one edge of the upper glass substrate thereof. The conductor terminal pads are connected by nearly transparent conductive paths to the segment electrodes and the planar ground electrode formed on the interior surfaces of the lower and upper substrates.

The LCD glass is typically mounted in association with a further substrate or printed circuit board having a pattern of conductive pathways or printed circuit conductors extending to and from a chip-on-board mounted integrated circuit and terminal pads formed on a surface thereof. Certain of the terminal pads are formed in a further linear array that is positioned in alignment with the linear array of terminal pads on the LCD glass by a mounting assembly. The LCD glass is typically spaced apart from the substrate or printed circuit board and supported by a non-conductive plastic spacer element in a sandwiched configuration. The spacer element also positions the terminal pads of the LCD glass in vertical alignment with the matching terminal pads of the printed circuit board. An electrical connection is made between the aligned terminal pads employing a flexible connector strip to interconnect the respective terminal pads on the parallel surfaces of the LCD glass substrate and the printed circuit. The LCD glass, connector strip, spacer element, and printed circuit board are held together by mounting bolts, screws, clips or accessory pieces that hold the sandwiched components of the LCD module together.

The flexible connector strip extends in the "Z"-direction between the aligned linear arrays of terminal pads on the parallel LCD glass and printed circuit board, whereas each terminal pad is connected to a respective conductive pathway or printed circuit conductor extending in the "X" and "Y"-directions on the surface of the respective substrate or printed circuit board. Such connector strips are formed of alternate conducting and insulating layers of an elastomeric, compressible material. Such connector strips are obtained from a number of manufacturers, including Technical Wire Products, Inc. of Cranford, N.J., which characterizes the connector strips as "Zebra" strips, and AMP Incorporated of Harrisburg, PA.

Preferably, the conducting layers of the connector strip are formed of non-woven carbon fibers impregnated with silicone rubber and the insulating layers are formed of pure silicone rubber. Because the connector strip is made of resilient elastomeric materials, it is highly tolerant of uneven surfaces and may be compressed so that the high modulus of the fibers allows them to penetrate any surface oxides on the mating surface, while the resiliency of the elastomer allows the connector to conform to irregular or warped surfaces. The conductors also move slightly in a lateral direction to provide a contact wipe during compression.

There are numerous examples of the use of such connector strips in assemblies of printed circuit boards, LCD modules, etc., as shown in U.S. Pat. Nos. 4,422,728; 4,545,647; 4,598,960; 4,643,499; 4,652,973; 4,878,738; and 5,033,970.

Data and control signals for operating the drive circuit for the LCD glass display are applied to input terminals of the driver IC in the chip-on board, and battery voltage and system ground are connected to both the display glass and to the driver IC through a flat, thin, multi-conductor, flexible film system or "flex circuit" of the type described, for example, in U.S. Pat. No. 4,655,551. In camera applications, the flex circuit extends between and is routed from the battery and various sensors and electro-mechanical camera mechanisms through narrow spaces inside the camera housing. The flex circuit is custom shaped and sized to fit a particular camera and eliminates a bulky wiring harness.

Generally, in camera manufacturing, it is desirable to reduce the number and size of separate components and the cost of assembling the camera from the components. The attachment of the flexible circuit to the printed circuit board of the LCD module of the above mentioned camera involves soldering its terminals to terminal pads on an exterior surface of the printed circuit board of the assembled LCD module.

Linear terminal pad arrays formed at the edge of printed circuit boards as male terminals may also connected to flexible circuits by mating female connectors.

In the '551 patent, a large scale LCD display is fabricated from the assembly of one or more drive flex circuits each carrying an IC chip, e.g. and LSI chip, in a film carrier type assembly into the layers of the flex circuit. Each such drive flex circuit has a set of input and output terminal pads or electrodes, wherein the output terminal pads are aligned with a connector strip for electrical connection to a linear array of LCD glass terminal pads, and the input terminal pads are aligned with terminal pads or electrodes of a further, transversely oriented, flex circuit. The transversely oriented flex circuit operates as a bus structure for distributing power and data signals to the one or more drive flex circuit. The assembly of the drive and bus flex circuits with the connector strip and LCD glass is accomplished by clamping these components against a base plate or to one another, without a base plate. The respective mating terminal pads of the bus and drive flex circuits are bonded or soldered together.

Other methods for electrically connecting LCD glass to flexible or hard printed circuits include cementing individual connector pins directly on the LCD glass in contact with the terminal pads with conductive adhesive, inserting the pins into holes in the printed circuit terminal pads, and soldering the pins to the surrounding terminal pads, which is labor intensive and does not take advantage of the flexible connector strips. This same approach may be employed in simply attaching flexible circuits to printed circuit terminal pads by pins extending from the printed circuit board terminal pads and through mating holes in the terminal pads of the flexible circuit and soldering the connections, which again is labor intensive and not easy to disassemble.

PROBLEMS TO BE SOLVED BY THE INVENTION

The attachment of the conductive terminal pads of the power and data supplying flex circuit with the hard printed circuit board supporting the drive IC circuit and associated with the LCD glass by the above approaches remains difficult to accomplish, adding to manufacturing costs, and may be overly bulky for the space allowed. The use of soldered connections, with or without pins, in tight spaces may lead to shorting of adjacent terminals, and the solder balls may interfere with positioning the LCD module in the space provided. A need remains for a simple, reliable connection that takes up little space and allows easy disassembly and reassembly.

SUMMARY OF THE INVENTION

Accordingly, it is an object of the present invention to simplify the assembly of flex circuit to a parallel stacked, printed circuit module while increasing the integrity and reliability of the assembly.

A further object of the present invention is to provide a cushioned support for separating parallel printed circuit boards or substrates while providing an electrical connection of respective terminal pads thereon and to the terminal pads of a flex circuit.

In a particular application, it is a still further object of the invention to provide a cushioned support for separating and electrically interconnecting the terminal pads of an LCD glass and an associated printed circuit board and to a flex circuit.

Still another object of the present invention is to provide a compressible and resilient spacer for spacing the LCD glass from the printed circuit board integrated with of a conductive carbon fiber connector strip for making the electrical interconnection between the terminal pads of the LCD glass and the printed circuit board and for making an electrical and mechanical interconnection between the terminal pads of the printed circuit board and a flex strip.

These and other objects of the present invention are realized in a first application for making the interconnection between first and second, parallel, spaced apart, circuit bearing, substrates or boards and a flex circuit formed on a flexible film, each substrate or board having a plurality of terminal pads formed in first and second arrays on the respective parallel surfaces thereof, at least one of the substrates or boards having a further plurality of terminal pads formed in a third array on the surface thereof, and the flex circuit having a plurality of terminal pads formed on a surface thereof in a fourth array matching the third array, through an assembly comprising: a unitary spacer element having a resilient, elastomeric frame for being positioned between and cushioning the spaced apart, circuit bearing, substrates or boards and having a resilient, elongated array of conductors formed as a connector strip along one side wall thereof, the conductor array configured to provide an electrical connection between the respective arrays of terminal pads formed on the surfaces of the parallel, circuit bearing, substrates or boards when positioned therebetween; and retainer means for compressing the unitary spacer element between the parallel, spaced apart, circuit bearing, substrates or boards to form a secure electrical connection between the first and second linear arrays of terminal pads and over the matching third and fourth arrays of terminal pads when the flex circuit is positioned with the third and fourth arrays of terminal pads in alignment.

More particularly, in accordance with a further aspect of the invention, a method and apparatus is provided for attaching an electro-optical assembly with a flex circuit, wherein the electro-optical assembly comprises: an electro-optical display panel of the type having display elements disposed thereon coupled to a plurality of terminal pads uniformly spaced apart in a first linear array on a surface of the panel through which drive signals are received for driving selected display elements; drive circuit means for providing the drive signals for energizing the selected display elements of the electro-optical panel mounted on a generally planar support having a plurality of terminal pads uniformly spaced apart in a second linear array on a surface of the support and a first plurality of circuit pathways extending between the second linear array of terminal pads and the drive circuit means; a unitary spacer element having a resilient, elastomeric frame for being positioned between and cushioning the circuit means from the electro-optical display panel and having a resilient, elongated array of conductors formed as a connector strip along one side wall thereof and configured to provide an electrical connection between the respective first and second linear arrays of terminal pads formed on the respective surface of the electro-optical display panel and the surface of circuit means; a third array of terminal pads formed on a region of the surface of the circuit means contacted by the unitary spacer element and positioned in a first pattern and having a second plurality of circuit pathways extending between the drive circuit means and said third array of terminal pads; and retainer means for compressing the unitary spacer element between the power providing means and the electro-optical display panel to form a secure electrical connection between the first and second linear arrays of terminal pads, and wherein said flex circuit further comprises: a length of flexible film having a third plurality of conductor paths formed thereon and coupled to a fourth array of terminal pads formed in a second pattern matching the first pattern, whereby, in assembly, the flex circuit is positioned between the region of the support means and the unitary spacer element so that the first and second patterns of the respective third and fourth arrays of terminal pads are aligned and in contact with one another, and the assembly of the flex circuit so disposed with respect to the electro-optical assembly is maintained by the retainer means.

In a preferred embodiment, the electro-optical display panel comprises an LCD glass, and the drive circuit means operates in response to electrical signals received on the flex circuit.

Moreover, the third array of terminal pads over which the fourth array of terminal pads on the flex circuit is positioned and retained may comprise a portion of the terminal pads in the second linear array. In this embodiment, the third array of terminal pads in the second linear array may occupy positions where there are no corresponding terminal pads in the first linear array. Alternatively, all or a portion of the terminal pads of the fourth array may be formed to extend through the flexible film and make electrical contact between all or a portion, respectively, of the first linear array and the second linear array through the connector strip in contact therewith.

Preferably, the printed circuit board contains a chip-on-board mounted drive circuit electrically connected to the conductive pattern for providing bias and drive signals on the second linear array of terminal pads, the chip-on-board mounted drive circuit being positioned between the side walls of the spacer element and attached to the surface of the printed circuit.

The attachment of the flex circuit employing the unitary spacer element incorporating the conductive connector strip advantageously decreases the number of components and eases handling during assembly of the LCD module.

BRIEF DESCRIPTION OF THE DRAWINGS

Other objects, advantages and features and the further scope of applicability of the present invention will become apparent from the detailed description given hereinafter in relation to the accompanying drawings, in which.

FIG, 6 is an exploded perspective view of the assembly of the components of the assembly of an LCD module and flexible circuit in accordance with a further embodiment of the present invention.

DETAILED DESCRIPTION OF THE PREFERRED EMBODIMENTS OF THE PRESENT INVENTION

Figure 1:
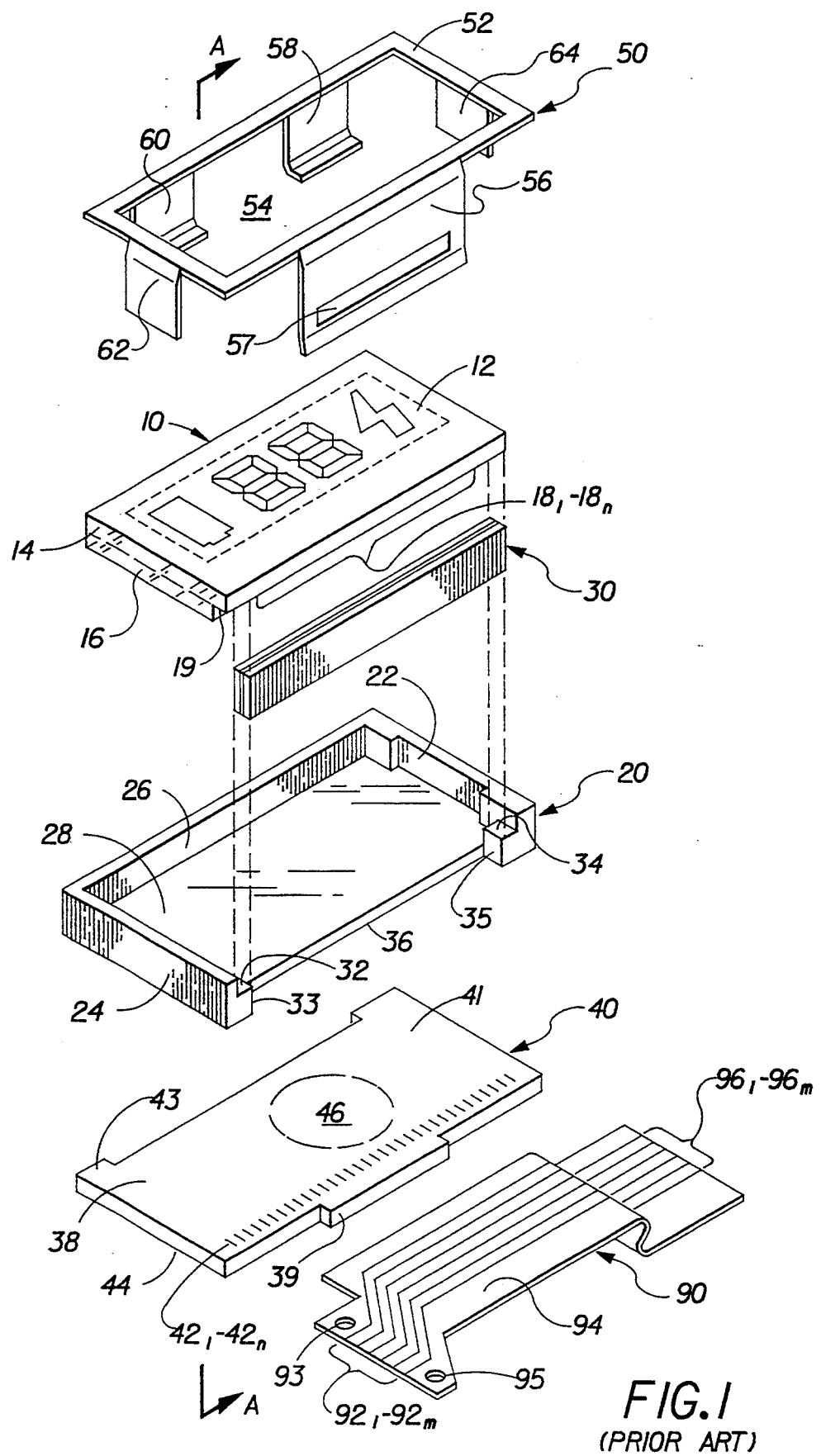
FIG. 1 is an exploded perspective of the assembly of components into an LCD module and the attachment of a flexible circuit of a type known in the prior art.
Figure 2:
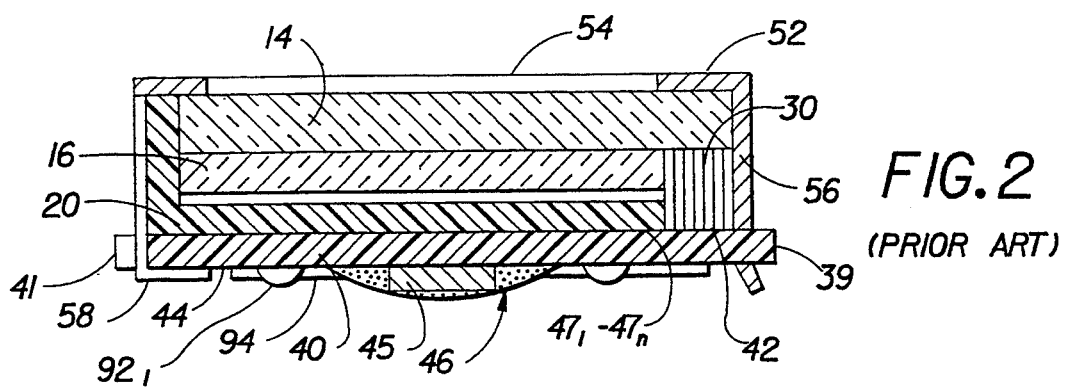
FIG. 2 is a schematic side view of a further prior art assembly of an LCD module with a flexible circuit.

Turning first to FIGS. 1 and 2, they depict the assembly of the components of a prior art LCD module from the Kodak "Cameo" camera in which the improved LCD module of the present invention may be employed. In FIG. 1, the LCD glass 10 contains an alpha-numeric display 12 formed between the first or upper glass substrate 14 and second or lower glass substrate 16 that are adhered together. The LCD glass 10 comprises, as is well known in the art and described above, liquid crystal composites interposed between the glass substrates 14 and 16, a pair of polarizers, a reflection plate, etc. and shaped segment electrodes and a common backing electrode positioned to form the segments of the alpha-numeric character display 12.

Each of the display electrode segments are coupled by nearly transparent deposited conductive pathways to a first linear array $18_1$–$18_n$ (not specifically shown) of terminal pads spaced apart along the interior surface 19 of the top substrate 14 in a manner well known in the art. Such LCD glasses are available from a number of suppliers, including Hamlin Corporation of Lake Mills, WI.

The LCD glass 10 is supported within the box-like, hard plastic spacer or tray 20 having three side walls 22, 24 and 26 and a bottom wall or floor 28. One side wall is left open to receive the conductive carbon fiber connector or Zebra strip 30. A pair of supporting shelf surfaces 32 and 34 are formed at the open ends of the side walls 22 and 24 respectively, for supporting the undersurface 19 of the LCD glass 10 that is nested within the side walls 22, 24 and 26 so that the exposed surface of substrate 16 rests slightly above the floor 28, when assembled. The connector or Zebra strip 30 fits beneath the first linear array $18_1$-$18_n$ of terminal pads formed on the surface 19 of the substrate 14 of LCD glass 10 and between the ends 33 and 35 of the shelf surfaces 32 and 34, respectively, in the space 36 therebetween.

The nested together LCD glass 10, spacer 20 and connector strip 30 are positioned on the upper surface 38 of printed circuit board 40 so that the conductive carbon fiber pathways of the connector strip 30 contact with the second linear array $42_1$-$42_n$ of terminal pads that are connected to a printed circuit network (not shown) extending (in this instance) through the printed circuit board 40 and to an integrated circuit mounted to the lower surface 44 thereof in the area indicated by the broken line circle. The integrated circuit attached to the printed circuit board 40 is referred to as a "chip-on-board" designated as 46 and includes the signal processing and drive circuit for energizing the selected segment electrode in the LCD display 12 to effect the display of alpha-numeric characters. The drive circuit responds to signals received on a third linear array of terminal pads (not shown) formed on the lower surface 44 and coupled thereto by printed circuit conductive pathways (not shown).

The LCD glass 10, the spacer 20, the connector strip 30 and the printed circuit board 40 are secured together by a cover member or retainer 50 having a top surface or window frame 52 surrounding a window 54 through which the LCD display 12 may be observed. Attachment and positioning tabs 56, 58, 60, 62, and 64 extend downward from the frame 52 and surround the sides of a sandwich assembly. Downwardly extending tabs 58 and 60 fit between the rear tabs 41 and 43 of the printed circuit board 40, and spring tab 56 has an opening 57 which receives the printed circuit board tab 39 when the spring tab 56 is slipped over the sandwiched components. Positioning tabs 62 and 64 restrain lateral movement of the assembled components.

A flex circuit 90 comprising an elongated flat film 94 having a plurality of terminal pads $92_1$-$92_m$ arrayed along one edge thereof in a fourth linear array and connected to printed circuit pathways $96_1$-$96_m$ extending lengthwise to remote sensors, the battery, the camera exposure control circuitry and the like. The signals and battery voltage are applied to the drive circuit in the chip-on-board integrated circuit 46 through further printed circuit pathways (not shown) formed on the lower surface 44 of the printed circuit board 40 when the flex circuit 90 is attached thereto.

The attachment of the flex circuit 90 to the lower surface 44 may be accomplished by bonding, clamping and/or soldering the fourth array of terminal pads $92_1$-$92_m$ to a matching third array of terminal pads formed on the lower surface 44. The alignment of the matching terminal pads may be facilitated by fitting reinforced circular holes 93 and 95 onto posts (not shown) formed on the surface 44.

Turning now to FIG. 2, it illustrates in a side elevation, cross-section view the assembly of the retainer 50, the LCD glass 10, the connector strip 30, the spacer 20 and the printed circuit board 40 into the LCD module and the attachment of the flex circuit 90 to the lower surface 44 of the of the printed circuit board 40. In this view, the chip-on-board 46 is formed on the lower surface 44 as an encapsulant enclosing the drive circuit IC 45 and lead wires extending to printed circuit paths on the lower surface 44 of the printed circuit board 40. In this configuration, the circuit paths are extended through the printed circuit board 40 and onto the surface 38 and from there in a pattern of printed circuit paths $47_1$-$47_n$ leading to the second linear array of terminal pads $42_1$-$42_n$ that are contacted by the connector strip 30.

The lower surface 19 of the substrate 14 bearing the first linear array of terminal pads $18_1$-$18_n$ for the conductive pathways leading to the electrodes or elements of the display 12 bears against the connector strip 30 so as to provide an electrical connection in the "Z"-direction between the respective first and second linear arrays of terminal pads. In order to maintain the assembly and to insure good electrical contact through the connector strip, the retainer 50 is fitted over the sandwiched LCD glass 10, support 20, connector strip 30 and printed circuit board 40.

The end of the flex circuit 90 bearing the fourth array of terminal pads $92_1$-$92_m$ may be seen in relation to the lower surface 44 of the printed circuit board 40 in FIG. 2. The array of terminal pads $92_1$-$92_m$ are attached to the matching third array of terminal pads on the lower surface 44 (not visible in FIG. 1) by soldering, as shown, for example, by the solder ball designated by $92_1$ in FIG. 2. Alternatively, attachment may be accomplished by clamping the matching third and fourth arrays together under pressure.

Figure 3:
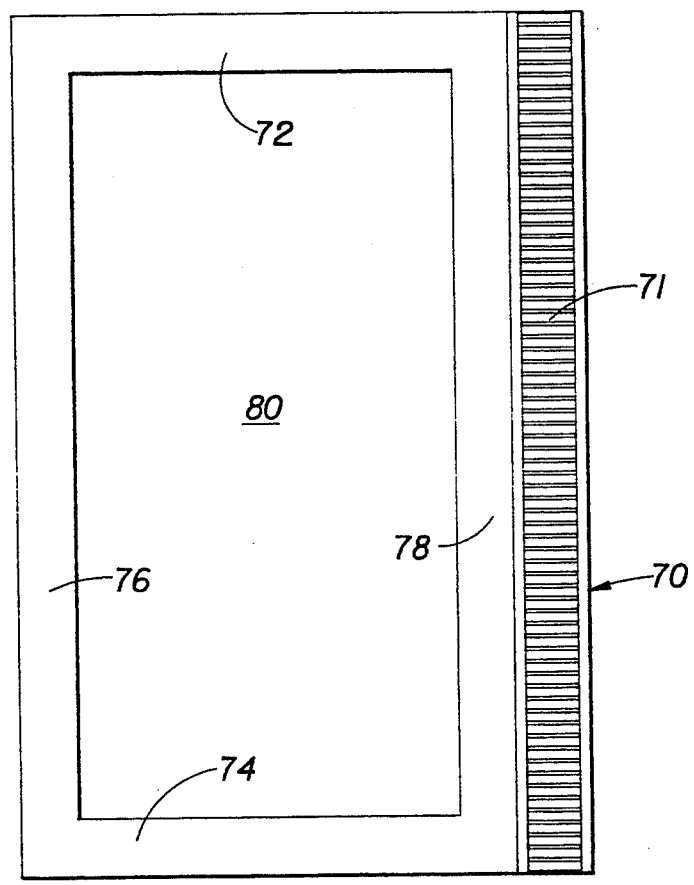
FIG. 3 is a top view of the integral spacer element and linear conductor strip that may be employed in the assembly of the LCD module and flexible circuit of the present invention.
Figure 5:
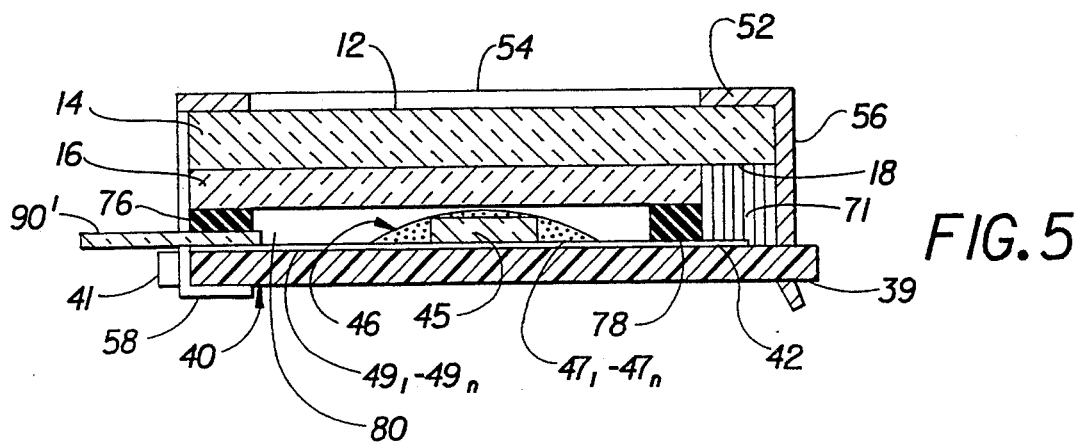
FIG. 5 is a cross-section elevation view taken along line B—B of FIG. 4 of the components of the assembly of the LCD module and flexible circuit in accordance with an embodiment of the present invention assembled together.
Figure 4:
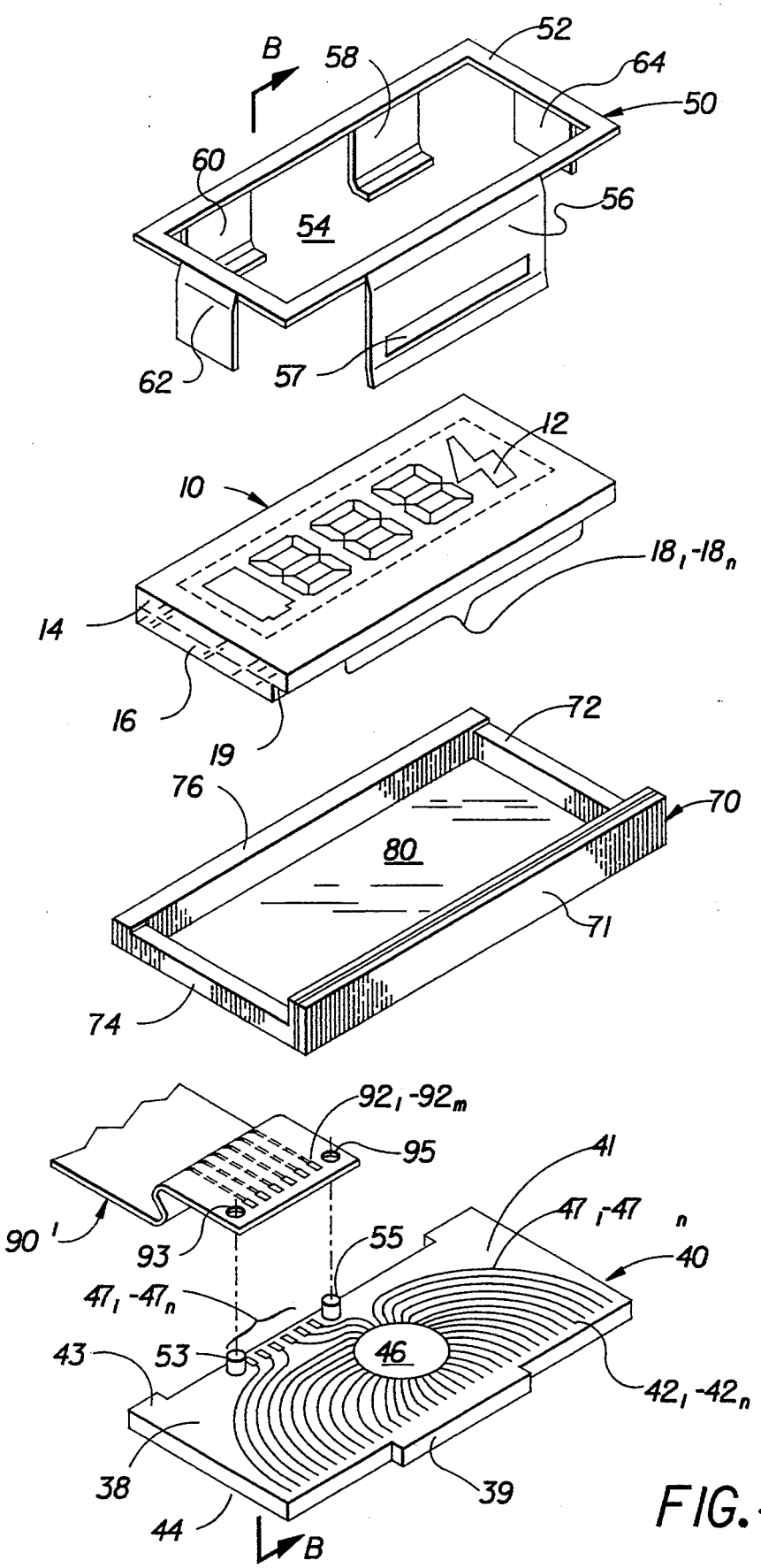
FIG. 4 is an exploded perspective view of the assembly of the components of the assembly of an LCD module and flexible circuit in accordance with one embodiment of the present invention.

Turning now to FIGS. 3-5, they illustrate a first embodiment of the present invention wherein a flex circuit is assembled with the assembly of an LCD module without the use of soldering or other forms of attachment other %ban pressure applied between the LCD glass 10 and the printed circuit board 40 through an integral spacer element 70 and retainer 50. The integral spacer element 70 and the method of assembling the components of the LCD module are described as well in the commonly assigned U.S. patent application Ser. No. 08/053,510 referred to above in the reference to related applications. Particular advantage is taken of the features of the integral spacer element 70 in this is embodiment.

The integral spacer element 70 comprises a combined elastomeric space frame surrounding an interior space 80 and a connector strip 71, with the LCD glass 10, the printed circuit board 40, and the retainer 50, into an LCD module, and the use of the integral spacer element 70 to form an attachment of the terminal pads of the flex circuit 90' to the third array of terminal pads $49_1$-$49_m$ on the printed circuit board 40. The integral spacer element 70 may be formed by molding a length of connector strip 71 to one elongated side wall 78 of the space frame surrounding space 80.

The side walls 72, 74, 76, 78 are molded of a compressible elastomeric material, e.g. silicon rubber, in a shape that provides peripheral support for the periphery of the lower surface of the lower substrate 16 of the LCD glass 10. The integral spacer element 70 is formed in a space frame shape having an empty center portion 80 to accommodate the raised chip-on-board 46 (with the integrated circuit chip 45 encapsulated therein) formed on the upper surface 38 of the printed circuit board 40. Thus, the thickness or width of each side wall 72, 74, 76, 78 may be selected to define the peripheral portions of the printed circuit board 40 and the LCD glass that they support.

Thus, in assembly, peripheral portions of the lower surface of substrate 16 and the lower surface 19 of the substrate 14, including the linear array $18_1$–$18_n$ of terminal pads, rest on the upper surfaces of the side walls 72 and 74 and front and rear walls 76 and 78 and the connector strip 71 of the integral spacer element 70. The spacer element 70 rests on the upper surface 38 of the printed circuit board 40 so that the connector strip 71 ms aligned over and in contact with the linear array 42 of terminal pads formed thereon. The assembly is secured in the manner described above with respect to FIG. I by the retainer 50.

FIGS. 4 and 5 also depict the attachment of the flex circuit 90′ between the side wall 76 of the spacer element 70 and the surface 38 of the printed circuit board 40, so that the third array of terminal pads $49_1$–$49_m$ are in contact with the fourth array of terminal pads $92_1$–$92_m$ and held there by pressure asserted through the side wall 76 by the retainer 50.

Usually, pressure alone is sufficient to retain the flex circuit in place, despite pulling force expected to be encountered in handling and use and exerted on the free end of the flex circuit 90′ once the retainer 50 applies force compressing the side wall 76. The pressure applied depends on the thicknesses of the LCD glass 10, the printed circuit board 40, the flex circuit 90′ and the side wall 76 in relation to the compressability thereof and the dimensions of the tabs 58 and 64. Such dimensions are selected to focus compression forces on the flex tape 90′ to inhibit release and to insure adequate electrical contact of the face to face terminal pads. Preferably, the terminal pads are gold plated to inhibit oxidation and loss of electrical continuity.

The fitting of the width of the flex circuit 90′ within the gap between the tabs 58 and 64 of the retainer 50 may provide lateral support to inhibit release of the flex circuit. This support may be enhanced by forming tabs at the end of the flex circuit 90′ extending laterally beneath the side wall 76 to or toward the side walls 72 and 74. Alternatively, as shown in FIG. 4, a pair of pins 55 extending upwardly from the surface 38 engages alignment holes 93, 95 in the flex circuit 90′ and further holes in the bottom surface of sidewall 76 to inhibit release of the flex circuit 90′ from the assembled LCD module by pulling force exerted therebetween.

FIG. 5 illustrates in a cross-section view the assembly of the retainer 50, the LCD glass 10, the integral spacer element 70 and the printed circuit board 40 together with the flex circuit 90′ shown in FIG. 4. The drive IC 45 within the chip-on-board encapsulant 46 positioned within the space 80 afforded by the integral spacer element 70. The first printed circuit conductor paths $47_1$–$47_n$ extend between the conductors of the integrated circuit chip 45 within the chip-on-board 46 along the surface 38 in a pattern illustrated generally in FIG. 4 extending beneath the integral elastomeric frame member 78 and to the second linear array of terminal pads $42_1$–$42_n$ below the integral connector strip 71. The resilient connector strip 71 and the space frame side and end walls 72, 74, 76 and 78 are compressed as described above by the retainer 50 to preferentially focus compression force on the side wall 76 and the connector strip 71 when the tab 39 of the printed circuit board 40 is inserted through the opening 57 in the downwardly extending spring tab 56 of the retainer 50.

The flex circuit 90′ is shown compressed between the side wall 76 and the third array of terminal pads $49_1$–$49_m$ in this embodiment of FIGS. 4 and 5. The space between the tabs 58 and 60 of the retainer 50 allows this position of the attachment to be accomplished. It will be understood that the third array of terminal pads $49_1$–$49_m$ may alternatively be positioned along any of the other three edges of the printed circuit board 40 and in a linear or a nonlinear pattern as long as the chosen array pattern films within a space on the surface 38 covered by one of the elastomeric side or end walls 72, 74, 76, or 78 and the tab positions of the retainer 50 are suitably altered.

Figure 6:
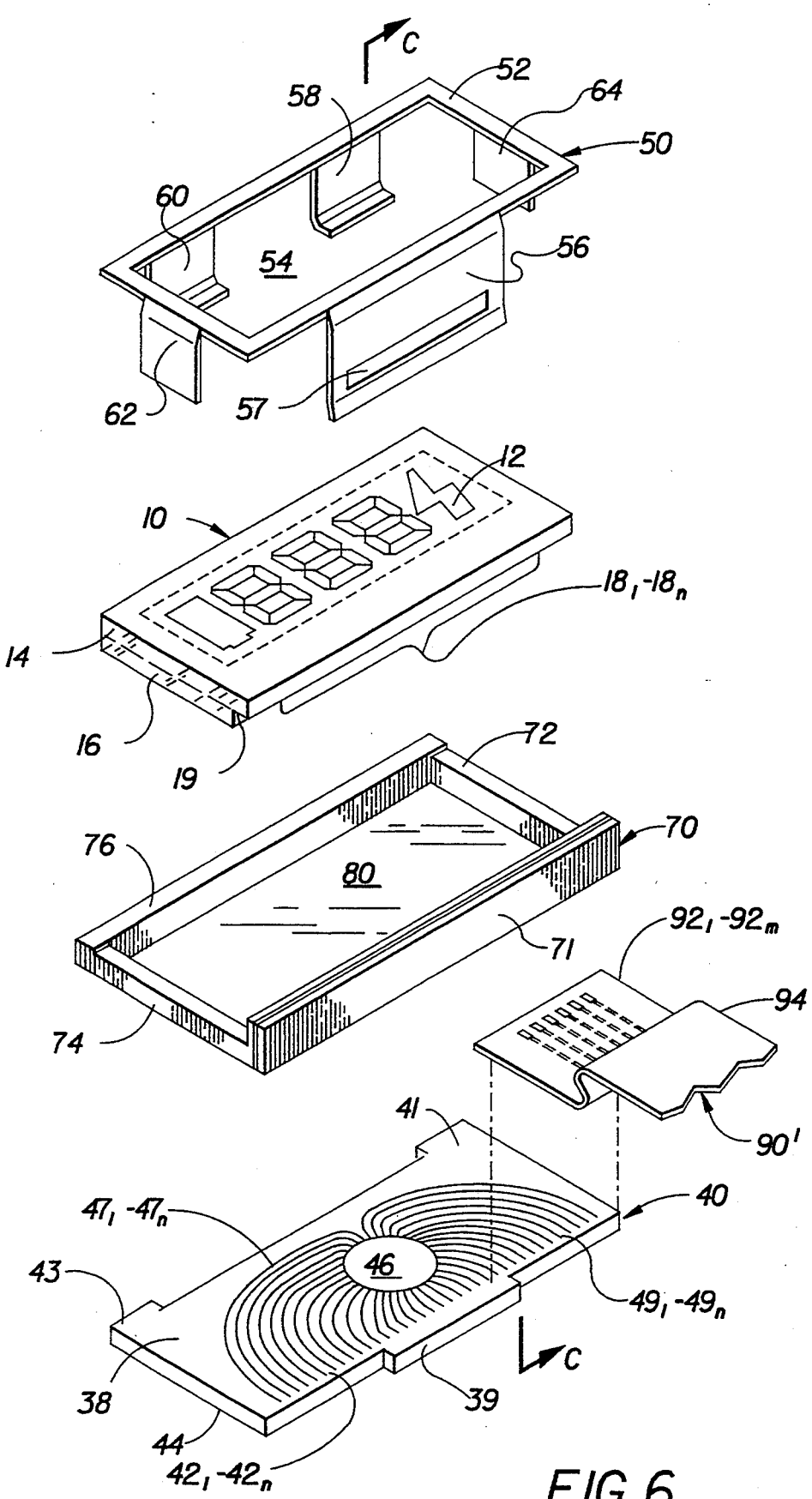

FIG. 6 depicts the general positioning of the flex circuit 90′ in relation to the connector strip 71 and the side wall 78 of the unitary spacer element 70 in a variation of the FIG. 4 and 5 embodiment described above. In this variation, the third array of terminal pads $49_1$–$49_m$ may be positioned in a staggered array below a portion of the side wall 78 and the flexible connector 30′. Moreover, certain of the fourth array of terminal pads $92_1$–$92_m$ matching certain of the terminal pads $49_1$–$49_m$ and aligned with the connector strip 71 may be conductive through the flexible film 94 to make the common electrical contact through conductive strip 71 with certain matching terminal pads $18_1$–$18_n$.

Figure 7:
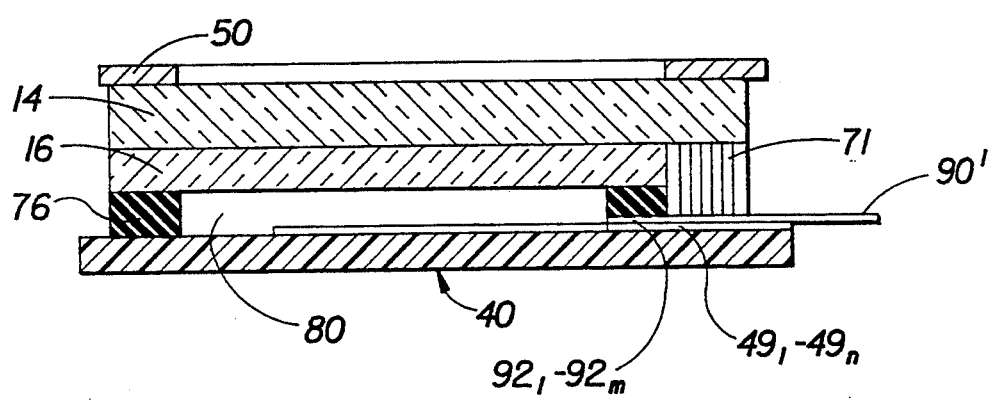
FIG. 7 is a cross-section elevation view taken along line C—C of FIG, 6 of the components of the assembly of the LCD module and flexible circuit in accordance with an embodiment of the present invention assembled together, The drawings are not necessarily to scale.

FIG. 7 schematically illustrates from a side cross-section view the general positioning of such a further flex circuit 90′ so that it extends beneath the connector strip 71 only and into contact with the third array of terminal pads co-linearly aligned with the second array of terminal pads (not specifically shown). The positioning of a suitably configured flex circuit 90′ to extend under the connector strip 30 (in substitution for the attachment of the flex circuit 90 shown in the prior art embodiment of FIGS. 1 and 2) or under the connector strip 71 and under the elastomeric side wall 78 involves consideration of the patterns of the first and second linear arrays of terminal pads. Generally speaking, the third linear array may be co-linear with the second linear array at one or both ends thereof on one both sides of the tab 39. In such an embodiment, the pattern of the first linear array of terminal pads $18_1$–$18_n$ may be truncated to avoid overlap with the pattern of the third linear array. In certain instances, where common electrical connections between selected terminal pads of the first, third and fourth arrays may be desired, it is contemplated that the selected terminal pads of the fourth array may extend through the flex circuit 90′ to contact both the selected terminal pad of the third array and the conductive elements of the connector strip 30 or 71.

The various embodiments of the assembly provided by the present invention of the flex circuit to the printed circuit board advantageously eliminates separate parts and simplifies assembly of stacked printed circuit boards and or substrates and, particularly, the respective linear arrays of terminal pads of the LCD glass and the printed circuit board of the disclosed LCD modules. Since the entire assembly is compressible, a tight fit (and proper compression of the terminal pads of the respective mating arrays) is achieved by over-sizing the thickness of the resilient elastomeric integral member with respect to overall thickness of each of the components of the sandwiched assembly.

Although several embodiments of the invention have been disclosed, it will be understood that further embodiments will be apparent to those of skill in the art. The integral spacer element comprising the resilient connector strip and support member may be devised in other shapes and configurations to accommodate the shape and configuration of the respective components of the LCD module or stacked circuit board or substrate in question.

It will also be understood that other forms of attachment of the components of the LCD module than the retainer 50 specifically illustrated may be employed to attach the components together and compress the elastomeric spacer and retain the flexible circuit.

In accordance with another advantage of the present invention, it will be realized that the attachment of the flex circuit terminal pads to the printed circuit or substrate terminal pads by use of the elastomeric spacer and/or connector strip provides enhanced shock and vibration resistance while reducing assembly time and the cost of stocking additional components.

Although the present invention has been fully described with reference to the preferred embodiments thereof, many modification and variations thereof will be apparent to those skilled in the art. The present invention is therefore not limited to the details of the preferred embodiments described above.

PARTS LIST

LCD glass 10
alpha-numeric display 12
first or upper glass substrate 14
second or lower glass substrate 16
a first linear array $18_1$–$18_n$ of terminal pads
interior surface 19
box-like spacer or tray 20
side walls 22, 24 and 26
bottom wall or floor 28
conductive carbon fiber connector or Zebra strip 30.
supporting shelf surfaces 32 and 34
ends 33 and 35
space 36 between ends 33 and 35
upper surface 38
printed circuit board tab 39
printed circuit board 40
tabs 41 and 43
second linear array $42_1$–$42_n$ of terminal pads
lower printed circuit board surface 44
drive circuit IC 45
chip-on-board 46
printed circuit paths $47_1$–$47_n$
third array of terminal pads $49_1$–$49_m$
cover member or retainer 50
top surface or window frame 52
pins 53, 55
window 54
spring tab 56,
opening 57
downwardly extending tabs 58 and 60
positioning tabs 62 and 64
integral spacer element 70
integral connector strip 71
side walls 72, 74, 76, 78
interior space 80
flex circuit 90
flex circuit 90'
plurality of terminal pads $92_1$–$92_m$
reinforced circular alignment holes 93 and 95
elongated flexible film 94
printed circuit pathways $96_1$–$96_n$

What is claimed is:

1. Apparatus for making an electrical interconnection between first and second, parallel, spaced apart, circuit bearing, substrates or boards and a flex circuit formed on a flexible film, each substrate or board having a plurality of terminal pads formed in first and second arrays on the respective parallel surfaces thereof, at least one of the substrates or boards having a further plurality of terminal pads formed in a third array on the surface thereof, and the flex circuit having a plurality of terminal pads formed on a surface thereof in a fourth array matching the third array, through an assembly comprising:

a unitary spacer element having a resilient, elastomeric frame with a plurality of side walls for being positioned between and cushioning the spaced apart, circuit bearing, substrates or boards and having a resilient, elongated array of conductors formed as a connector strip along one side wall thereof, the conductor array configured to provide an electrical connection between the respective arrays of terminal pads formed on the surfaces of the parallel, circuit bearing, substrates or boards when positioned therebetween; and retainer means for compressing the unitary spacer element between the parallel, spaced apart, circuit bearing, substrates or boards to form a secure electrical connection between the first and second arrays of terminal pads and for also compressing the unitary spacer element over the matching third and fourth arrays of terminal pads when the flex circuit is positioned with the third and fourth arrays of terminal pads in alignment.

2. Apparatus for connecting an LCD module of the type comprising an LCD glass having a first array of terminal pads and a drive circuit attached to a printed circuit board or substrate having a second array of terminal pads to a flex circuit having a further array of terminal pads comprising:

a third array of terminal pads on the printed circuit or substrate;

compressible and resilient spacer means for spacing the LCD glass from the printed circuit board integrated with a conductive connector strip for making the electrical interconnection between the first and second arrays of terminal pads of the LCD glass and the printed circuit board, respectively, and for making an electrical and mechanical interconnection between the further array of the terminal pads of the flex circuit and the third array of terminal pads on the printed circuit or substrate; and means for applying force to hold the LCD glass, the compressible and resilient spacer means, the flex circuit and the printed circuit board or substrate in a stacked arrangement.

3. The apparatus of claim 2 wherein the LCD glass has alpha-numeric character forming, electrode segments, and the drive circuit operates in response to electrical signals received on the flex circuit to energize the electrode segments to form visible alpha-numeric characters.

4. The apparatus of claim 2 wherein the third array of terminal pads on the surface of the printed circuit board or substrate over which the further array of terminal pads on the flex circuit is positioned and retained comprises a portion of the terminal pads in the second array of terminal pads.

5. The apparatus of claim 4 wherein the third array of terminal pads in the second array of terminal pads occupy positions where there are no corresponding terminal pads in the first linear array.

6. An apparatus for attaching an electro-optical assembly with a flex circuit for coupling electrical power and drive signals to the electro-optical assembly, wherein the electro-optical assembly comprises:

an electro-optical display panel of the type having display elements disposed thereon coupled to a plurality of terminal pads uniformly spaced apart in a first linear array on a surface of the panel through which drive signals are received for driving selected display elements;

a drive circuit for providing the drive signals for energizing the selected display elements of the electro-optical panel mounted on a generally planar support having a plurality of terminal pads uniformly spaced apart in a second linear array on a surface of the support and a first plurality of circuit pathways extending between the second linear array of terminal pads and the drive circuit means;

a unitary spacer element having a resilient, elastomeric frame for being positioned between and cushioning the drive circuit and the planar support from the electro-optical display panel and having a resilient, elongated array of conductors formed as a connector strip along one side wall thereof and configured to provide an electrical connection between the respective first and second linear arrays of terminal pads formed on the respective surface of the electro-optical display panel and the surface of circuit means;

a third array of terminal pads formed in a first pattern on a region of the surface of the planar support for the drive circuit contacted by the unitary spacer element and coupled to a second plurality of circuit pathways formed on the planar support and extending between the drive circuit and the third array of terminal pads; and retainer means for compressing the unitary spacer element between the drive circuit planar support and the electro-optical display panel to form a secure electrical connection between the first and second linear arrays of terminal pads;

and wherein said flex circuit further comprises:

a length of flexible film having a third plurality of conductor pathways formed thereon and coupled to a fourth array of terminal pads formed in a second pattern matching the first pattern, whereby, in assembly, the flex circuit is positioned between the region of the planar support and the unitary spacer element so that the first and second patterns of the respective third and fourth arrays of terminal pads are aligned and in contact with one another, and the assembly of the flex circuit so disposed with respect to the electro-optical assembly is maintained by the retainer means.

7. The apparatus of claim 6 wherein the electro-optical display panel comprises an LCD glass having alpha-numeric character forming electrode segments, and the drive circuit operates in response to electrical signals received on the flex circuit to energize the electrode segments to form visible alpha-numeric characters.

8. The apparatus of claim 6 wherein the third array of terminal pads on the surface of the planar support over which the fourth array of terminal pads on the flex circuit is positioned and retained comprises a portion of the terminal pads in the second linear array.

9. The apparatus of claim 8 wherein the third array of terminal pads in the second linear array occupy positions where there are no corresponding terminal pads in the first linear array.

10. The apparatus of claim 6 wherein the planar support is a printed circuit board and the drive circuit is chip-on-board mounted to a surface of the printed circuit board and electrically connected to the first and second pluralities of circuit pathways formed on a surface of the printed circuit board, the chip-on-board mounted drive circuit being positioned between the side walls of the spacer element.

11. A method of assembling an electro-optical device to a flex circuit comprising the steps of:

providing an electro-optical panel having display elements disposed thereon and coupled to a plurality of terminal pads spaced apart in a first linear array on the panel;

providing a drive circuit for the display elements of the electro-optical panel having a plurality of terminal pads spaced apart in a second linear array to which power and drive signals for the display elements of the electro-optical panel are applied by the drive circuit and having a further plurality of terminal pads spaced apart in a third array for receiving power and control signals for application to the drive circuit;

providing a flex circuit having a fourth array of terminal pads spaced apart in a pattern to match the spaced apart terminal pads of the third array;

positioning the fourth array of terminal pads in contact with the third array of terminal pads;

positioning a unitary spacer element, having a resilient, elastomeric frame, between the drive circuit and the electro-optical panel so that the unitary spacer element overlies the fourth and third arrays of terminal pads, the fourth array of terminal pads being sandwiched between the third array of terminal pads and the unitary spacer element; and compressing the unitary spacer element between the drive circuit means and the electro-optical display panel to form a secure electrical connection between the third and fourth arrays of terminal pads.

12. The method of claim 11 wherein the unitary spacer element is provided with a resilient, elongated array of conductors formed as a connector strip along one side wall thereof and configured to provide an electrical connection between the respective first and second linear arrays of terminal pads, and the positioning and compressing steps further comprise:

positioning the unitary spacer element so that the elongated array of conductors of the connector strip extends between the first and second linear arrays; and compressing the unitary spacer element so as to make electrical contact between the first and second arrays of terminal pads and the third and fourth arrays of terminal pads, respectively.

* * * * *